United States Patent [19]

Drexler

[11] Patent Number: 4,470,101

[45] Date of Patent: Sep. 4, 1984

[54] APPARATUS FOR THE MOUNTING AND WIRING OF PRINTED CIRCUIT BOARDS

[75] Inventor: Rudolph A. Drexler, Bristol, Vt.

[73] Assignee: Simmonds Precision Products, Inc., Tarrytown, N.Y.

[21] Appl. No.: 427,277

[22] Filed: Sep. 29, 1982

[51] Int. Cl.³ .............................................. H05K 1/14
[52] U.S. Cl. .................................... 361/415; 361/399; 361/412
[58] Field of Search ......................... 361/412, 415, 399

[56] References Cited

U.S. PATENT DOCUMENTS

| | | |
|---|---|---|
| 2,798,559 | 6/1957 | Feucht . |
| 3,257,585 | 6/1966 | Ransom et al. . |
| 3,479,568 | 11/1969 | Shapiro et al. ....................... 361/415 |
| 3,539,874 | 11/1970 | Swanson ............................... 361/412 |
| 3,596,140 | 7/1971 | Walsh . |
| 3,992,654 | 11/1976 | Springer et al. ..................... 361/415 |
| 4,161,017 | 7/1979 | Pierce et al. ......................... 361/412 |

FOREIGN PATENT DOCUMENTS

| | | |
|---|---|---|
| 2812362 | 3/1979 | Fed. Rep. of Germany ...... 361/415 |
| 876790 | 9/1961 | United Kingdom . |
| 943804 | 12/1963 | United Kingdom . |
| 949823 | 2/1964 | United Kingdom . |
| 1004813 | 9/1965 | United Kingdom ................ 361/415 |
| 1016842 | 1/1966 | United Kingdom . |
| 1038381 | 8/1966 | United Kingdom . |
| 1135194 | 12/1968 | United Kingdom . |
| 1584491 | 2/1981 | United Kingdom . |

Primary Examiner—R. R. Kucia
Attorney, Agent, or Firm—Cushman, Darby & Cushman

[57] ABSTRACT

An apparatus for mounting a plurality of electrical circuit boards in a spaced-apart coaxial relationship while yet permitting the circuit boards to be eccentrically moved out of the coaxial relationship during manufacture and/or maintenance. A first elongated, preferably hollow, mounting member transverse to the circuit boards mounts them for pivotable movement about a transverse axis defined by the first member. A second mounting member may be employed so as to effect rigid union between the circuit boards in an engaged position and which pivots to a disengaged position to permit eccentric pivotable movement of the circuit boards about the transverse axis defined by the first mounting member.

13 Claims, 3 Drawing Figures

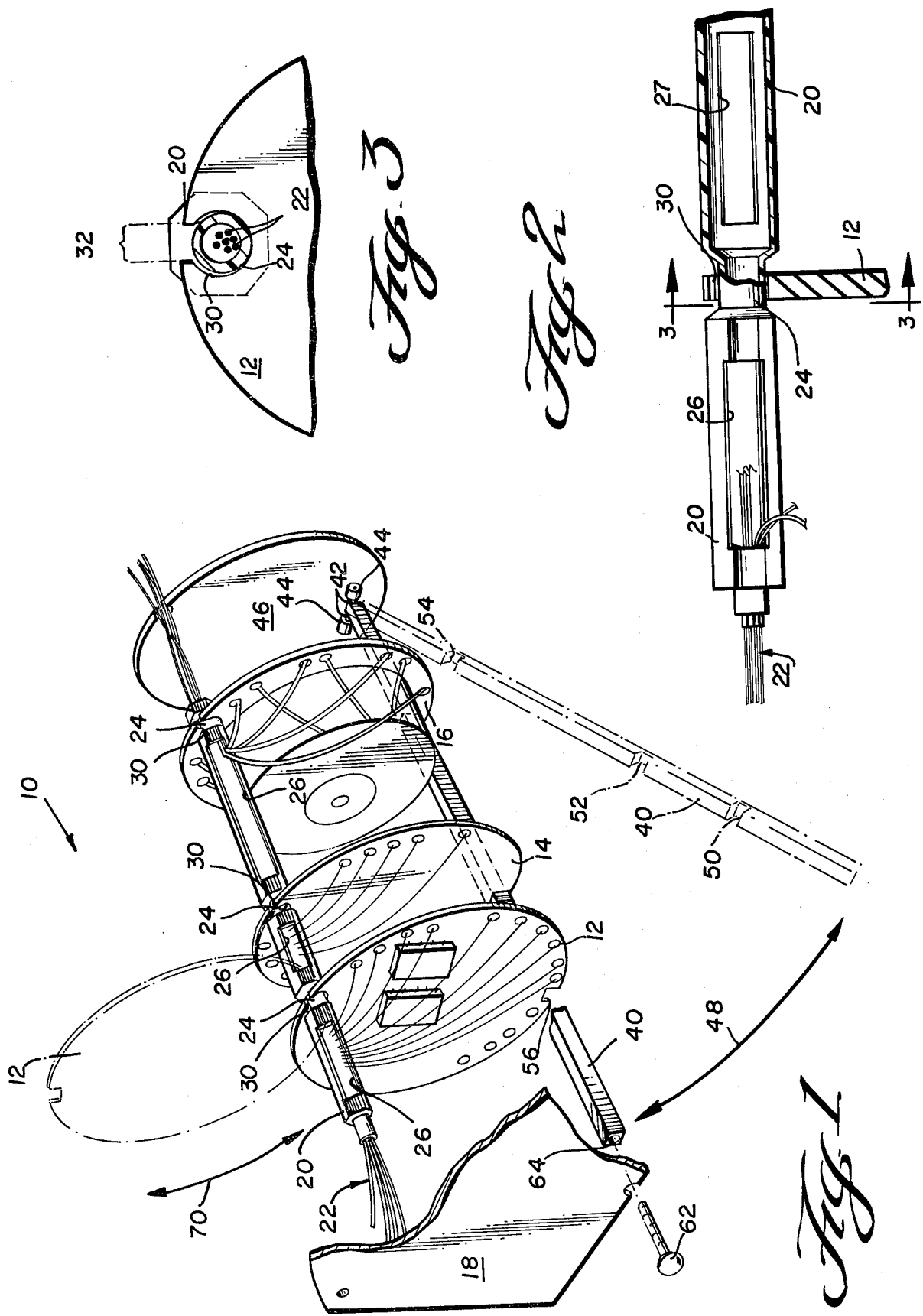

APPARATUS FOR THE MOUNTING AND WIRING OF PRINTED CIRCUIT BOARDS

BACKGROUND AND SUMMARY OF THE PRESENT INVENTION

1. Introduction

The present invention is generally related to a novel apparatus for mounting printed circuit boards in a stacked coaxial relationship to one another as conventionally done for components in electrical equipment, e.g. aircraft instrumentation. More particularly, the present invention provides a novel system for the stacked assembly of printed circuit boards which facilitates the eccentric pivotal movement and isolation of selected boards out of the coaxial relationship so as to facilitate the manufacture, and/or repair thereof.

As used herein, the term "coaxial relationship" refers to the usual stacked alignment and mounting of individual circuit boards one on top of another or one behind the other, etc. Additionally, the term "eccentric pivotal movement" or like terms refers to pivotal movement of each of the circuit boards about a transverse axis passing through other than the geometric center of the board.

In accordance with the present invention selected ones of a plurality of coaxially assembled, or "stacked", printed circuit boards can be eccentrically pivoted about an axis tranverse to the individual planes of such circuit boards so as to selectively move them out of the coaxial assemblage. Moreover, wiring which interconnects the individual circuit boards of the assembly is neatly and conveniently housed in an interconnecting structure which not only defines the axis of pivotal movement for the circuit boards but also facilitates such pivotal movement by establishing a wiring manifold at least partially coincident with the pivotal axis which thus enables eccentric pivotal movement of the individual circuit boards to occur without substantially disturbing the interconnecting wiring system of the assembly.

2. Description of the Prior Art

Those in the art to which the present invention pertains have continually sought improved means for contiguously mounting an assembly of printed circuit boards as evidenced, for example, by reference to U.S. Pat. No. 4,161,017 to Pierce et al; U.S. Pat. No. 3,539,874 to Swanson; and U.S. Pat. No. 2,796,559 to Feucht.

Pierce et al disclose a prior art device which permits pivotal movement of printed circuit boards about axes within or parallel to the planes defined by respective circuit boards. Thus, according to the proposal of Pierce et al, if a circuit board located relatively deep in the stack is to be isolated, all circuit boards prior to the desired board must be successfully pivoted about their different respective axes to permit unobstructed access thereto. This arrangement is particularly disadvantageous if the circuit board assembly is located in an area of severe spatial limitations. Moreover, since the Pierce et al device contemplates pivotal movement about stacked axes, sufficient slack wire must be provided to permit the extent of pivotal movement necessary for each of the circuit boards in the assembly. It is surmised that upon pivotal movement of the circuit boards, portions of such slack wire may become pinched between the hinge mechanisms or otherwise restrict the intended hinge movements or be exposed to potential damage.

Swanson discloses that a cradle structure having a plurality of spaced slots can be utilized to hold a stacked arrangement of printed circuit boards. However, as depicted in FIGS. 2 and 3 of the Swanson patent, when predetermined ones of the circuit boards are desired to be removed, they are simply lifted out of the engaging relationship with their associated slot. This form of an arrangement, therefore, utilizes only the interconnecting wiring per se as a means of maintaining the integrity of the assembly when one or more boards are removed from the cradle which could place unnecessary and potentially damaging stresses upon the points of wiring contact with the circuit boards.

Feucht discloses that a rigid spacer member can be utilized in combination with a plurality of circuit boards so as to maintain the separation distance therebetween. However, Feucht does not contemplate pivotal movement of any of the circuit boards comprising his assembly as his main concern is with providing an apparatus for an assembly of circuit boards which operates as a heat sink so as to dissipate sink generated by the individual electrical components comprising his assembly.

3. Summary of the Present Invention

As the reader will undoubtedly appreciate, the above prior art proposals have disadvantages with respect to ease of access to an individual printed circuit board, and with respect to the placement of undue stresses upon the interconnecting wiring.

Briefly stated, the present invention is particularly adapted to an improved assembly of stacked printed circuit boards so as to facilitate manufacturing and/or repair. According to the present invention an elongated wiring manifold is provided which transversely connects the circuit boards and also establishes a transverse axis of rotation about which the individual boards comprising the assembly can be eccentrically rotated or pivoted. Furthermore, the wiring manifold serves as a receptacle or housing for the interconnecting wiring thereby ensuring that such wiring is substantially undisturbed during pivotal movement of the circuit boards. The manifold is provided with circuit board engageable portions spaced along its axial dimension at predetermined intervals so as to establish the desired separation distance between adjacent circuit boards. To ensure that circuit boards pivoted out of alignment with the others are freely accessible, it is desirable to establish the pivotal point of connection with the manifold at a point near the circumferential edge of each board (e.g. at a point far removed from the board center point).

To establish a rigid union between the individual circuit boards in their normal coaxial position yet to permit predetermined eccentric pivotal movement thereof about the transverse axis defined by the wiring manifold, I prefer to provide a mounting spacer leg or equivalent structures which can be moved into and out of an engageable relationship with the circuit boards in the assembly. Preferably, the mounting spacer leg is disposed opposite and parallel to the wiring manifold and defines a plurality of seats or notches spaced along its axial length corresponding to the desired separation distances of the circuit boards in the assembly. A roll pin can be provided on one end of the mounting spacer leg which cooperates with aperture-defining lobes formed on a suitable backing plate so as to establish a hinged connection therewith.

Thus, when structural rigidity is required (e.g. when the circuit boards are in their normal coaxial relationship), the mounting spacer leg need only be pivoted into an engaged relationship with the individual circuit boards so as to permit the seats defined by the mounting spacer leg to register with a corresponding edge portion of each of the circuit boards. Of course, when required, the mounting spacer leg can be disengaged from the circuit boards by virtue of its hinged movement and selected ones of the circuit boards can thereafter be eccentrically pivoted out of their normal coaxial relationship about the wiring manifold as has been briefly described above.

Further advantages and objects of the present invention will become more clear to the reader after careful consideration is given to the following detailed description of the presently preferred exemplary embodiment:

BRIEF DESCRIPTION OF THE ACCOMPANYING DRAWING

Reference will hereinafter be made to the accompanying drawing wherein like numerals throughout the various figures denote like structural elements, and wherein:

FIG. 1 is a perspective view of the presently preferred exemplary embodiment of the present invention;

FIG. 2 is a detailed side elevational view partly in section of a portion of the wiring manifold of FIG. 1; and FIG. 3 is a detailed front elevational view taken along line 3—3 in FIG. 2.

DETAILED DESCRIPTION OF THE PRESENTLY PREFERRED EXEMPLARY EMBODIMENT

An assembly 10 of representative printed circuit boards 12, 14 and 16 is depicted in perspective at FIG. 1. As shown therein, circuit boards 12, 14 and 16 are assembled in an aligned coaxial relationship and are separated from one another by predetermined dimensions. The separation dimensions between boards can be equal but need not be and, in fact, practice has shown that varying separation dimensions are usually necessary to accommodate various types of circuit boards (e.g. compare board 14 to board 16).

When an assembly of printed circuit boards is utilized as a component, for example, in aircraft instrumentation, a face plate 18 is typically provided for mounting a visual read-out for instrumentation data, etc. Since the data of the aircraft instrumentation art is presently utilizing digital technology, the face plate 18 is typically provided with LED displays (not shown) so as to exhibit the desired data in a humanly-readable form. While reference is herein made to aircraft instrumentation, the reader should appreciate that this merely represents a presently preferred embodiment and is therefore nonlimiting. The present invention can be advantageously utilized in any other electronic system having stacked printed circuit boards assembled as a component thereof.

One feature of the present invention resides in the use of wiring manifold 20 which extends transverse to circuit boards 12, 14 and 16. Wiring manifold 20 is preferably a hollow structure (see FIGS. 2 and 3) which permits interconnecting wires 22 to pass therethrough and be housed therein. However, manifold 20 can be provided as a solid element if desired for some applications or with openings therethrough only in areas where the circuit boards are attached. In such an arrangement, manifold 20 would not need to be hollow but would preferably include an aperture therethrough having openings on both sides of the circuit board to permit wires 22 to pass from one side of the circuit board to the other side thereof.

Along the manifold's axial length, portions 24 of reduced cross sectional area are provided at predetermined board spacing intervals. Portions 24 are utilized as a connection point for a circuit board and permit rotational movement of the circuit board about the elongated axis of manifold 20. Additionally, the dimension between successive ones of portions 24 establishes the separation distance between adjacent circuit boards. Thus, manifold 20 by virtue of portions 24 operates as a spacer to help maintain the desired spacing between circuit boards.

As shown more clearly in FIGS. 1 and 2, manifold 20 in the areas between the circuit boards preferably includes at least one window 26 which allows wires 22 to be directed to the circuit boards for electrical connection. An opposing window 27 (see FIG. 2) can be provided if desired.

In order to establish pivotal movement about the axis of manifold 20, a suitable cooperating aperture 30 (shown more clearly in FIG. 3) is defined in each of the circuit boards 12, 14 and 16. Circuit board 12 is shown in FIGS. 2 and 3 as being representative of each circuit board in the assembly. As depicted, aperture 30 is preferably circular in shape so as to receive and cooperate with the exterior surface of manifold portion 24. A neck 32 having a dimension less than the widest cross-sectional dimension of portion 24 is provided so as to permit board 12 to be press-fitted upon manifold 20. Thus, upon press-fitting board 12 onto portion 24, a snug connection is effected yet pivotal movement is permitted thereabout.

In general, the geometry of either manifold 20 and circuit boards 12, 14 and 16 is for the most part not critical to the proper functioning of the present invention. Thus, rectangular manifolds or other cross-sectional shapes in addition to square, hexagonal or like forms of circuit boards can be used. Of course, the manifold portions 24 should preferably have an outer circular cross section to permit pivotal movement of the board thereabout.

To ensure structural rigidity of the assembly 10 of circuit boards 12, 14 and 16, a mounting spacer leg 40 is provided which can be moved into and out of an engaged relationship with circuit boards 12, 14 and 16. Leg 40 is preferably disposed opposite and parallel to manifold 20 but other suitable arrangements can clearly be devised. Additionally, if desired, more than one leg 40 can be utilized—especially if additional reinforcement of the assembly 10 is desirable or necessary for certain situations. The degree of reinforcement for the circuit board assembly 10 shall be left to the discretion of those in the art and, accordingly, the operability of only a single mounting leg 40 is here described in detail.

Mounting leg 40 includes a transverse pin 42 on one end which is positioned between and pivotally received within lobes 44 which may be integrally provided on the lower portion of back plate 46. Thus, pin 42 and lobes 44 together cooperate to permit hinged movement (arrow 48) of leg 40 towards and away from circuit boards 12, 14 and 16. In the normal engaged position (noted as solid line in FIG. 1), leg 40 cooperates with an edge of each of circuit boards 12, 14 and 16. Preferably, seats 50, 52 and 54 are defined in leg 40 and they respectively engage notches 56, 58 and 60 defined in boards 12, 14 and 16. Notches 56, 58 and 60 can, however, be dispensed with in favor of seats 50, 52 and 54 and, in such an arrangement, seats 50, 52 and 54 would cooperate with a portion of the circumferential edge of each of circuit boards 12, 14 and 16.

Although not necessary, back plate 46 can be attached to manifold 20 in a manner similar to the attachment of circuit boards 12, 14 and 16 already described. In fact, back plate 46 may comprise another printed circuit board if desired. Additionally, leg 40 can be retained in its normal, engaged position via a conventional screw or pin 62 inserted through face plate 18 and which cooperates in a threaded or other cavity 64 formed in the leading end of leg 40. Alternatively, external threads may be integrally provided on the leading end of leg 40 extending through face plate 18 so as to threadingly cooperate with a nut (not shown).

When it is desired to gain access to a predetermined one of circuit boards 12, 14 and 16, for example, circuit board 12, leg 40 need only be pivotably moved (arrow 48) away from assembly 10 to a position noted in phantom line in FIG. 1. Thereafter, circuit board 12 can be eccentrically pivoted (arrow 70) about the transverse axis provided by manifold 20 to a position shown by phantom line in FIG. 1. It should be noted that eccentric pivotal movement of circuit board 12 is always within a common plane since the axis about which it pivots (e.g. manifold 20) is transverse to the plane of circuit boards 12, 14 and 16. Thus, ready access to any of the circuit boards 12, 14 and 16 can be conveniently established.

The component structures of the present invention can be produced from any material of sufficient strength and rigidity. However, when utilized in aircraft instrumentation, lightweight, yet structurally sound materials such as plastic, aluminum, or the like are naturally preferred. When utilizing such materials, the manifold and leg spacer structures of the present invention can be produced by any shaping technique conventionally practiced, e.g. extrusion, turning, milling, etc.

I presently prefer that manifold 20 be a unitary structure yet it may be comprised of a series of discrete units having various axial lengths. If so, manifold 20 may be constructed by press fitting or otherwise connecting such discrete units until the desired length is obtained and in such a sequence to effect the desired spacing between the circuit boards in the assembly.

Manifold 20 may also be sold in the market as a separate unit having interconnecting wires already placed therein as a replacement for worn or damaged wires in existing instrumentation units or to facilitate the manufacture of new units. Thus, the manifold 20 can be provided as a "wiring harness" already assembled with wires to facilitate repair or manufacture of instrumentation.

As the reader will now undoubtedly realize, the present invention provides significant advantages heretofore unavailable with the prior art devices. Accordingly, while the present invention has been herein described in what is presently conceived to be the preferred embodiment, those in the art may wish to make modifications which nevertheless retain many of the novel advantages and features of this invention. The appended claims are intended to encompass all equivalent structures, devices and/or assemblies representing such modifications.

What is claimed is:

1. An assembly comprising:
    a plurality of electrical circuit boards each including means defining a generally circular aperture of predetermined diameter disposed near the periphery of said board and further defining a neck area having a dimension less than said diameter to permit access to said aperture; and
    elongated mounting means for mounting said circuit boards in a spaced-apart coaxial relationship, said mounting means being disposed transverse to said circuit boards and including pivot means for pivotably attaching said circuit boards to said mounting means while permitting eccentric pivotal movement of each said circuit board substantially within its own plane so that predetermined boards can be moved out of and back into said coaxial relationship about a transverse axis defined by said mounting means, wherein
    said pivot means includes means defining plural cylindrical areas of a reduced cross-sectional dimension axially spaced apart with respect to one another to define the separation distances between said boards, each of said board apertures accepting a respective one of said areas in press-fitting relationship by virtue of said neck area to mount said boards to said mounting means while yet permitting said eccentric pivotal movement thereof about said axis.

2. An assembly as in claim 1 further comprising second mounting means for selectively effecting rigid union of said circuit boards in said coaxial relationship.

3. An assembly as in claim 2 wherein said first mentioned mounting means comprises an elongated hollow member for housing electrical interconnect wiring therein.

4. An assembly as in claim 2 or 3 wherein said second mounting means comprises an elongated member including a plurality of notches each registrable with a portion of a predetermined one of said circuit boards.

5. Apparatus for mounting a plurality of spaced apart electrical circuit boards so as to permit predetermined boards to be moved out of and into alignment with the others of said circuit boards, said apparatus comprising:
    a plurality of circuit boards,
    means defining an elongated axis transverse to the plane of each said circuit board and establishing an axis about which said circuit boards are pivotably moveable, said axis defining means including means defining plural areas along said axis defining means, said areas having a reduced outside cross-sectional dimension, and
    connecting means associated with each said circuit board for connecting said axis defining means and said circuit boards for eccentric pivotal movement of said circuit boards between normal and distal positions about said axis defining means, each said pivotal movement occurring substantially within the plane defined by the respective circuit board, and wherein said connecting means includes means defining a generally circular aperture disposed near the periphery of each said board and a neck area communicating with said aperture to permit each said board to be press-fitted onto a respective one of said areas, each said aperture thereby accepting said respective area therein, to mount each said board to said axis defining means while yet permitting said eccentric pivotal movement thereof.

6. Apparatus as in claim 5 further comprising mounting means for selectively engaging said circuit boards and for establishing rigid union therebetween when in their normal positions.

7. Apparatus as in claim 6 wherein said mounting means include hinge means permitting said mounting means to be hingedly moved between engaged and disengaged positions relative said circuit boards whereby in said engaged position, rigid union is effected between said circuit boards, and in said disengaged position pivotal movement of said circuit boards about said axis defining means is permitted.

8. Apparatus as in claim 7 wherein said mounting means comprises at least one elongated member including a plurality of notches at least equal in number to said plurality of circuit boards, each of said notches being registrable with a predetermined portion of an associated one of said circuit boards in said engaged position.

9. Apparatus as in claim 5, 6, 7 or 8 wherein said axis defining means further includes an interior cavity for housing electrical wiring therein.

10. Apparatus as in claim 9 wherein said areas are at least equal in number to said plurality of circuit boards and are spaced along the axial length of said axis defining means to establish said spaced apart relationship of said circuit boards.

11. Apparatus as in claim 10 wherein said axis defining means is a unitary structure.

12. Apparatus as in claim 5 wherein said axis defining means is a unitary structure.

13. Apparatus for the mounting of plural spaced apart circuit boards to permit each said board to be moved out of and into alignment with the others of said circuit boards, said apparatus comprising:
plural circuit boards;
an elongated rigid mounting member defining an axial hollow cavity in which wiring, interconnecting said circuit boards, is placed, said mounting member defining plural areas of substantially circular cross-sectional axially separated from one another by predetermined dimensions; wherein
each said circuit board defines a generally circular aperture disposed near the periphery of said board and a neck area having a dimension less than said aperture and in communication therewith to permit access to said aperture, each said board being connected transverse to said mounting member by press fitting cooperation of said apertures with respective ones of said areas to thereby define a separation distance between adjacent boards which corresponds to said predetermined dimensions, said apertures and areas permitting eccentric pivotal movement of each such board into and out of said alignment with the others of said boards.

* * * * *